(12) United States Patent  
Oliver et al.

(10) Patent No.: US 7,511,684 B2
(45) Date of Patent: Mar. 31, 2009

(54) IMAGE ALIGNMENT METHOD FOR BINOCULAR EYEWEAR DISPLAYS

(75) Inventors: Manuel Oliver, Scottsdale, AZ (US); Joseph W. Bostaph, Gilbert, AZ (US)

(73) Assignee: Motorola, Inc., Schaumburg, IL (US)

( * ) Notice: Subject to any disclaimer, the term of this patent is extended or adjusted under 35 U.S.C. 154(b) by 330 days.

(21) Appl. No.: 11/497,016

(22) Filed: Jul. 31, 2006

(65) Prior Publication Data

US 2008/0024391 A1    Jan. 31, 2008

(51) Int. Cl.
*G09G 5/00* (2006.01)
*G02F 1/1335* (2006.01)

(52) U.S. Cl. ............. 345/8; 345/7; 349/11; 349/13; 349/15

(58) Field of Classification Search ........... 345/7–9; 359/630, 632; 349/1–17
See application file for complete search history.

(56) References Cited

U.S. PATENT DOCUMENTS

| | | | |
|---|---|---|---|
| 5,739,797 A * | 4/1998 | Karasawa et al. | 345/8 |
| 5,886,822 A | 3/1999 | Spitzer | |
| 6,023,372 A | 2/2000 | Spitzer | |
| 6,091,546 A | 7/2000 | Spitzer | |
| 6,191,809 B1 | 2/2001 | Hori | |
| 6,204,974 B1 | 3/2001 | Spitzer | |
| 6,327,079 B1 * | 12/2001 | Namii et al. | 359/376 |
| 6,349,001 B1 | 2/2002 | Spitzer | |
| 6,356,392 B1 | 3/2002 | Spitzer | |
| 6,384,982 B1 | 5/2002 | Spitzer | |
| 6,396,461 B1 * | 5/2002 | Lewis et al. | 345/7 |
| 6,618,099 B1 | 9/2003 | Spitzer | |
| 6,753,828 B2 * | 6/2004 | Tuceryan et al. | 345/8 |
| 6,829,095 B2 | 12/2004 | Amitai | |
| 6,879,443 B2 | 4/2005 | Spitzer | |
| 6,880,931 B2 | 4/2005 | Moliton | |
| 2003/0184860 A1 | 10/2003 | Hakkinen | |

FOREIGN PATENT DOCUMENTS

WO  WO2004/049736   6/2004
WO  WO2006/058188   6/2006

* cited by examiner

*Primary Examiner*—David L Lewis

(57) ABSTRACT

A method is provided for aligning, without user interaction, the two images of a binocular eyewear display (100) with respect to their vertical, horizontal, and rotational orientation, and with respect to magnification. The method for aligning images comprise generating a signal from a display modification system (108) based on stored values indicative of misalignment of the binocular eyewear display (100); and adjusting, in accordance with the signal, an image or images to be displayed by an optics system (106). The stored values may include values for a plurality of temperatures and humidity.

19 Claims, 2 Drawing Sheets

IMAGE ALIGNMENT METHOD FOR BINOCULAR EYEWEAR DISPLAYS

FIELD OF THE INVENTION

The present invention generally relates to binocular eyewear displays and more particularly to a method of aligning, without user interaction, the two images of a binocular eyewear display with respect to their vertical, horizontal, and rotational orientation, and with respect to magnification.

BACKGROUND OF THE INVENTION

Binocular displays include head mounted displays such as glasses and helmet mounted displays wherein a virtual image is presented to each eye. The image, usually created by a microdisplay, for example an LCD screen, may be presented to the eye by means of refractive or reflective optics, for example, through a lens system. Ideally the virtual images presented to each eye are perfectly aligned and the user perceives a single image similar to their perception of real images. If the virtual images are misaligned, the user may experience discomfort, for example, eye strain, headache, and nausea.

Commercial binocular eyewear are aligned mechanically during manufacture and some misalignment is common. Furthermore, misalignment of binocular eyewear may occur during use due to physical shock or exposure to temperature or humidity. Although there are no widely accepted standards for alignment, there have been several studies to determine acceptable values of binocular image alignment. A compilation of the desired alignment tolerances to avoid user discomfort is as shown in the following table as disclosed in Melzer & Moffitt, *Head Mounted Displays-Designing for the User*, New York: McGraw-Hill, 1997 (ISBN 0070418195).

| PARAMETER | REQUIREMENT (see-through) | REQUIREMENT (immersive) |
| --- | --- | --- |
| VERTICAL | 3 minutes of arc | 5 minutes of arc |
| HORIZONTAL | 3 minutes divergent; 8 minutes convergent | diopter of focus distance |
| IMAGE ROTATION | 1 degree | 1 degree |
| MAGNIFICATION | 1 percent | 1 percent |

Although vendors of commercial eyewear displays are aware of the need for binocular image alignment, products today are not shipped with any alignment specifications.

Systems have been disclosed wherein a user of the binocular eyewear may take corrective steps to bring the misalignment within certain tolerances. See for example, in US 2003/0184860, the user operates a device to move a dot until it is aligned with another dot, and in WO 2006/058188, the user adjusts first and second display panels until images of display panel indicia shown on the viewing screen are located relative to baseline indicia.

However, users of systems requiring user intervention to properly align the system may find it burdensome to perform such intervention, especially when it may be required each time the system is turned on.

Accordingly, it is desirable to provide a method of aligning, without user interaction, the two images of a binocular eyewear display with respect to their vertical, horizontal, and rotational orientation, and with respect to magnification. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

A method is provided for aligning, without user interaction, the two images of a binocular eyewear display with respect to their vertical, horizontal, and rotational orientation, and with respect to magnification. The method for aligning images comprise generating a signal from a display modification system based on stored values indicative of misalignment of the binocular eyewear display; and adjusting, in accordance with the signal, an image or images to be displayed by an optics system. The stored values may include values for a plurality of temperatures and humidity.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Commercial binocular eyewear are aligned mechanically at manufacture and some misalignment is common. By measuring the optical misalignment, e.g., at the factory or subsequently at a sales or repair facility, and storing misalignment parameters such as vertical, horizontal, rotation, and magnification, in memory integral to the eyewear, correction may be made automatically without user interaction to bring the alignment within desired limits. A first image is presented to a first eye and a second image is presented to a second eye. A microcomputer may adjust at least one of the first and second images, e.g., by shifting or rotating pixels, in accordance with the stored parameters. Additionally, the optical misalignment may be measured at a plurality of temperatures and humidity with the misalignment at each temperature and humidity stored. Subsequently, the misalignment at a current temperature and/or humidity may be adjusted in accordance with the stored values.

Figure 1:
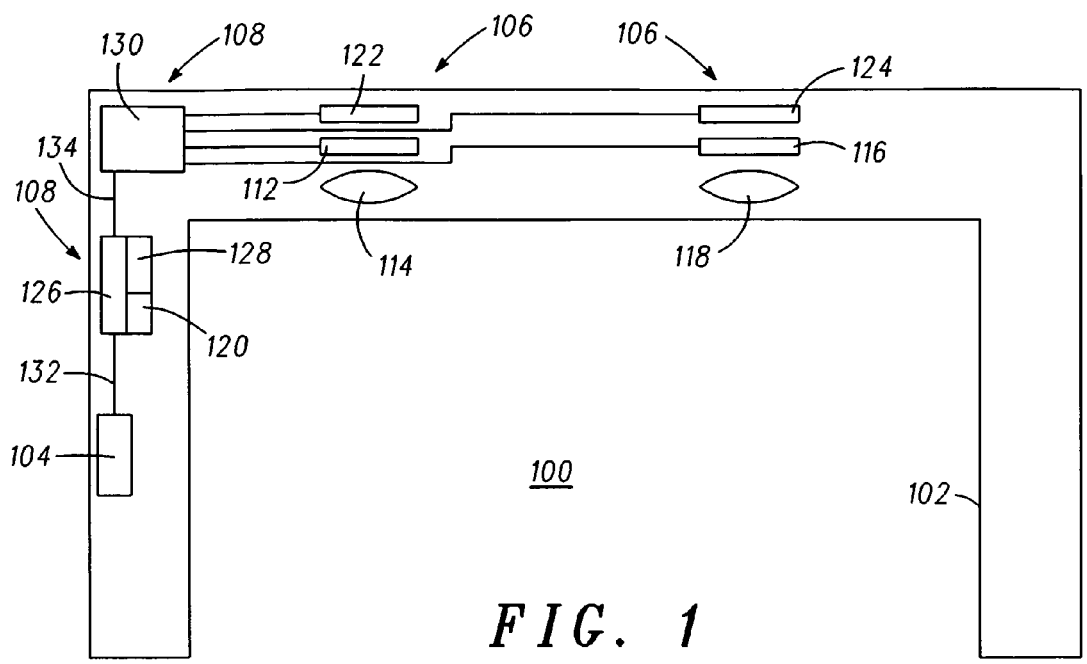
FIG. 1 is a top schematic view of an exemplary embodiment of a binocular display device.

Referring to FIG. 1, a binocular display device 100 in accordance with an exemplary embodiment comprises a housing 102 including an image receiving device 104, optics system 106, and display modification system 108. The image receiving device 104 may, for example, comprise an input (not shown) for wired or wireless coupling or an electronic device for receiving and reading video data from a DVD or the like. The optics system 106 includes a first microdisplay 112 and a first lens 114 for displaying an image for an eye, and a second microdisplay 116 and a second lens 118 for displaying the image to the other eye. The optical system 106 may also include backlights 122 and 124 for lighting the microdisplays 112 and 116. It should be understood that there are many types of optical systems that may include, for example, mirrors and/or waveguides. It should be understood the present invention should not be limited by the type of image receiving device 104 or the type of optics system 106 described herein. The display modification system 108 includes a microcomputer 126 and memory 128 coupled to the image receiving device 104, and a display driver 130 coupled between the microcomputer 126 and the microdisplays 112 and 116. The display modification system 108 may further include an environmental sensor 120 for sensing, for example, the temperature and/or humidity. The microcomputer 126 and/or the memory 128 may be integrated into the binocular display device 100 or may reside elsewhere and be coupled electronically to the binocular display device 100.

When an image, which typically would comprise a video stream, is received by the image receiving device 104, it is transmitted to the microcomputer 126 via first connector 132. The image is then transmitted to the display driver 130 via second connector 134, and to first and second microdrivers 112 and 116 via third connector 136 and fourth connector 138, respectively, for viewing.

When the binocular display device 100 is fabricated, misalignment parameters are stored in the memory 128. When an image is to be displayed, the microcomputer 126 retrieves these misalignment parameters from the memory 128 and instructs the display driver 130 as appropriate to modify the image for display by the first microdisplay 112 and/or the second microdisplay 116 to compensate for the misalignment of the binocular display device 100.

Figure 2:
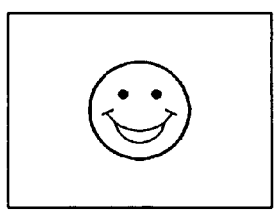
FIG. 2 is a projected image free from misalignment.
Figure 3:
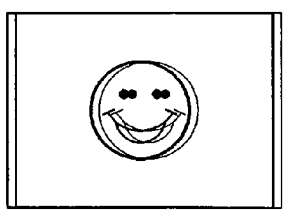
FIG. 3 is a projected image having horizontal misalignment.
Figure 4:
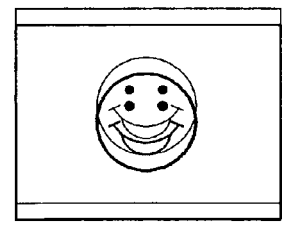
FIG. 4 is a projected image having vertical misalignment.
Figure 5:
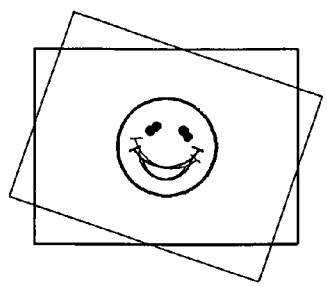
FIG. 5 is a projected image having rotational misalignment.
Figure 6:
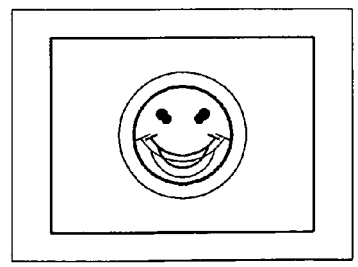
FIG. 6 is a projected image having magnification misalignment.

The illustration shown in FIG. 2 is representative of an aligned image. Types of image misalignment that may be encountered by the binocular display device 100 included horizontal misalignment (FIG. 3), vertical misalignment (FIG. 4), rotational misalignment (FIG. 5), and magnification misalignment (FIG. 6). The image misalignment can be corrected either by mechanical or electronic means.

Mechanical means of alignment may involve mechanical adjustment of either the image source, for example a microdisplay, or by adjustment of optical components between the image source and the eye, for example a lens. Because of the very small image alignment tolerances, the required mechanical adjustment may be prohibitively expensive to execute during or after manufacture of the device. The mechanical precision required may be on the order of 1 micron to 1 mm depending on the mechanism used to make the adjustment. Utilizing only mechanical alignment has limitations. One limitation is that it can be difficult or expensive to realign the images after the device is manufactured because it may require disassembly and of the eyewear display and for some components to be debonded. Also, it is not possible to correct for misalignment that may result from changes in temperature at which the device operates.

Electronic image alignment can overcome some of the limitations of mechanical image alignment. Horizontal or vertical image alignment of the image presented to both eyes is accomplished by shifting pixels in one or both of the images presented by the display drivers 130. In the chart below, it is shown that by shifting an image by one pixel shifts results in an angular change of 1.5 to 3.75 minutes of arc for the selected resolutions. This enables the very tight vertical and horizontal image alignment tolerances to be met simply through the electronic image adjustment. This chart uses values for a typical eyewear display with a 25 degree diagonal field of view with a 4:3 aspect ratio for the image.

| Field of view | Resolution | One pixel shift corresponds to: | Alignment tolerance |
|---|---|---|---|
| 15 degrees vertical | QVGA (240 vertical pixels) | 3.75 minutes | 3 minutes (see-through) |
| | VGA (480 vertical pixels) | 1.875 minutes | 5 minutes (immersive) |
| | SVGA (600 vertical pixels) | 1.5 minutes | |
| 20 degrees horizontal | QVGA (320 horizontal pixels) | 3.75 minutes | 3 to 8 minutes (see through) |
| | VGA (640 horizontal pixels) | 1.875 minutes | |
| | SVGA (800 horizontal pixels) | 1.5 minutes | |

Although adjustments for vertical and horizontal image alignment can be accomplished by shifting the image on a microdisplay, obtaining proper alignment with respect to rotation and magnification may be more complex manipulation of the initial image. A microcomputer may be required to calculate the corrected image.

Figure 7:
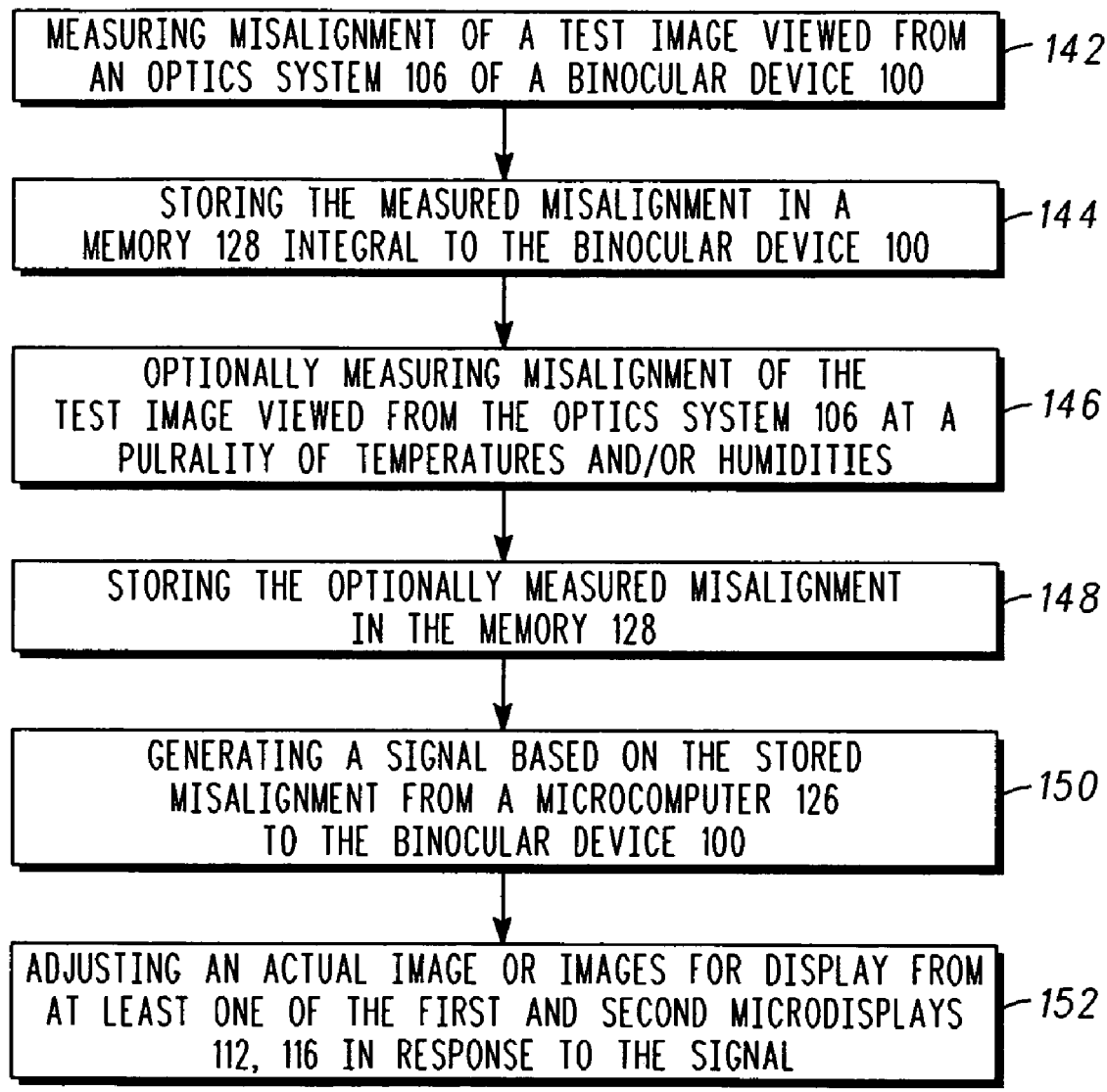
FIG. 7 is a flow chart of steps of the exemplary embodiment.

A flow chart of the steps implemented by the microcomputer 126 is shown in FIG. 7. First, the misalignment of a test image viewed from the display driver 130 of the binocular device 100 is measured 142. The measured misalignment is stored 144 in memory 128. Optionally, misalignment of the viewed test image is measured 146 for a plurality of temperatures and/or humidity and stored 148. The temperature and humidity is sensed by the environmental sensor 120. When the user turns on the binocular display device 100 and an actual image is received for display by the microdisplays 112, 116, the microcomputer 126 generates 150 a signal to the display driver 130. The actual image to be displayed by the microdisplays 112 and 116 is adjusted 152 to improve any misalignment between the images presented to each eye.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

The invention claimed is:

1. A method for aligning first and second images displayed by a binocular device having an optics system and a display modification system wherein values indicative of misalignment of the optics system are stored in the display modification system, comprising:
   generating a signal from the display modification system based on the stored values;
   adjusting, in accordance with the signal, the first image to align with the second image for display by the optics system;
   displaying the first image by the optics system to an eye; and
   displaying the second image by the optics system to another eye.

2. The method of claim 1 wherein the first and second images each comprise a plurality of pixels, the adjusting step comprising shifting the pixels of the first image in at least one direction with respect to the optics system.

3. The method of claim 1 wherein the first and second images each comprise a plurality of pixels, the adjusting step comprising rotating the pixels of the first image with respect to the optics system.

4. The method of claim 1 wherein the first and second images each comprise a plurality of pixels, the adjusting step comprising modifying the magnification of the pixels of the first image.

5. The method of claim 1 wherein the values indicative of misalignment are for a plurality of temperatures, the method further comprising determining the current temperature, and wherein the adjusting step comprises adjusting the first image in accordance with the stored misalignment for the current temperature.

6. The method of claim 1 wherein the values indicative of misalignment are for a plurality of humidity, the method further comprising determining the current humidity, and wherein the adjusting step comprises adjusting the first image in accordance with the stored misalignment for the current humidity.

7. A method for aligning images displayed by a binocular device having an image receiving device, an optics system, and a display modification system, comprising:
   receiving a test image by the image receiving device, the test image comprising first and second image;
   measuring misalignment of the first and second images viewed from the optics system;
   storing the misalignment in the display modification system;
   receiving an actual image by the image receiving device, the actual image comprising third and fourth image;
   generating a signal from the display modification system based on the stored misalignment; and
   adjusting, in accordance with the signal, at least one of the third and fourth images to be displayed by the optics system to reduce the misalignment of the third and fourth images to be viewed; and
   displaying the third image to one eye and the fourth to the other eye.

8. The method of claim 7 wherein the third and fourth images each comprise a plurality of pixels, the adjusting step comprising shifting the pixels of the third image in at least one direction with respect to the optics system.

9. The method of claim 7 wherein the third and fourth images each comprises a plurality of pixels, the adjusting step comprising rotating the pixels of the third image with respect to the optics system.

10. The method of claim 7 wherein the third and fourth images each comprises a plurality of pixels the adjusting step comprising modifying the magnification of the pixels of the third image.

11. The method of claim 7 wherein the measuring step comprises:
   measuring the misalignment at a plurality of temperatures; and
   wherein the adjusting step comprises:
   determining the current temperature; and
   adjusting the third image in accordance with the stored misalignment for the current temperature.

12. The method of claim 7 wherein the measuring step comprises:
   measuring the misalignment at a plurality of humidity; and
   wherein the adjusting step comprises:
   determining the current humidity; and
   adjusting the third image in accordance with the stored misalignment for the current humidity.

13. A method for aligning a binocular device having a first microdisplay for displaying a first image to an eye and a second microdisplay for displaying a second image to another eye, each of the first and second images comprising an array of pixels, a memory device, and a microcomputer, wherein values indicative of misalignment of the binocular device are stored in the memory device, comprising:
   generating a signal from the microcomputer based on the stored values; and
   adjusting, in accordance with the signal, the array of pixels of the first image; and
   displaying the first image as adjusting on the first microdisplay and the second image on the second microdisplay.

14. The method of claim 13 wherein the adjusting step further comprises shifting the pixels of the first image in at least one direction with respect to the optic system.

15. The method of claim 13 wherein the adjusting step further comprises rotating the pixels of the first image with respect to the optics system.

16. The method of claim 13 wherein the adjusting step further comprises modifying the magnification of the pixels of the first image.

17. The method of claim 13 wherein the values indicative of misalignment are for a plurality of environmental parameters, the method further comprising determining the current environmental parameter, and wherein the adjusting step comprises adjusting the plurality of pixels of the first image in accordance with the stored misalignment for the current environmental parameter.

18. The method of claim 13 wherein the values indicative of misalignment are for a plurality of temperatures, the method further comprising determining the current temperature, and wherein the adjusting step comprises adjusting the plurality of pixels of the first image accordance with the stored misalignment for the current temperature.

19. The method of claim 13 wherein the values indicative of misalignment are for a plurality of humidity, the method further comprising determining the current humidity, and wherein the adjusting step comprises adjusting the plurality of pixels of the first image accordance with the stored misalignment for the current humidity.

* * * * *